United States Patent
Fukada et al.

(10) Patent No.: US 10,499,163 B2
(45) Date of Patent: Dec. 3, 2019

(54) MICROPHONE ASSEMBLY

(71) Applicant: HOSIDEN CORPORATION, Yao-shi, Osaka (JP)

(72) Inventors: Naosuke Fukada, Kuratemachi (JP); Mayumi Kaneko, Kuratemachi (JP); Ryuji Awamura, Kuratemachi (JP); Hidenori Motonaga, Kuratemachi (JP); Kensuke Nakanishi, Kuratemachi (JP)

(73) Assignee: HOSIDEN CORPORATION, Yao-Shi, Osaka (JP)

( * ) Notice: Subject to any disclaimer, the term of this patent is extended or adjusted under 35 U.S.C. 154(b) by 0 days.

(21) Appl. No.: 16/053,245

(22) Filed: Aug. 2, 2018

(65) Prior Publication Data
US 2019/0069095 A1 Feb. 28, 2019

(30) Foreign Application Priority Data
Aug. 25, 2017 (JP) ................. 2017-162257

(51) Int. Cl.
*H04R 19/04* (2006.01)
*H01R 12/52* (2011.01)
(Continued)

(52) U.S. Cl.
CPC .......... *H04R 19/04* (2013.01); *H01R 12/523* (2013.01); *H04R 1/04* (2013.01); *H04R 19/005* (2013.01); *H04R 2201/003* (2013.01)

(58) Field of Classification Search
CPC ........ H04R 19/04; H04R 19/005; H04R 1/04; H04R 2201/003; H04R 2201/029;
(Continued)

(56) References Cited

U.S. PATENT DOCUMENTS

2003/0223204 A1* 12/2003 Tandai ................. H05K 1/115
361/767
2006/0199425 A1* 9/2006 Izuchi ................. H04R 1/083
439/500
(Continued)

FOREIGN PATENT DOCUMENTS

DE 102017202568 * 6/2017
EP 1699258 A1 9/2006
(Continued)

OTHER PUBLICATIONS

Extended European Search Report for European Application No. EP 18186792.0, published by the European Patent Office (EPO), dated Jan. 23, 2019, including corresponding Communication, 1-page Annex, Information on Search Strategy, and 4-page EPO Form 1703.

*Primary Examiner* — Fan S Tsang
*Assistant Examiner* — Angelica M McKinney
(74) *Attorney, Agent, or Firm* — Kilyk & Bowersox, P.L.L.C.

(57) ABSTRACT

A microphone assembly including a main board and a microphone. The microphone includes a capacitor or a MEMS chip, a case accommodating the capacitor or the MEMS chip, and a microphone board electrically connected to the capacitor or the MEMS chip. The microphone board has a larger outer dimension than the case and includes a fixing portion and a connecting portion. The case is fixed onto the fixing portion. The connecting portion is a portion of the microphone board, the portion being located outside the case and electrically and mechanically connected to the main board.

19 Claims, 11 Drawing Sheets

(51) Int. Cl.
*H04R 1/04* (2006.01)
*H04R 19/00* (2006.01)

(58) Field of Classification Search
CPC .. H04R 2201/02; H04R 19/016; H04R 1/083;
H01R 12/62; H01R 12/613; H01R 12/61;
H01R 12/59; H01R 12/585; H01R 12/57;
H01R 12/526; H01R 12/523; B81C
1/0023; H05K 1/115; H05K 1/141
See application file for complete search history.

(56) References Cited

U.S. PATENT DOCUMENTS

| | | | |
|---|---|---|---|
| 2007/0041597 A1* | 2/2007 | Song | B81C 1/0023 381/175 |
| 2009/0161894 A1* | 6/2009 | Kimura | H04R 19/016 381/174 |
| 2010/0183181 A1* | 7/2010 | Wang | H04R 19/005 381/361 |
| 2010/0202649 A1* | 8/2010 | Inoda | H04R 1/021 381/361 |
| 2011/0149543 A1* | 6/2011 | Kamoi | H05K 1/141 361/803 |

FOREIGN PATENT DOCUMENTS

| | | |
|---|---|---|
| EP | 1755360 A1 | 2/2007 |
| JP | 2010062800 A | 3/2010 |
| WO | 2015177060 A1 | 11/2015 |

\* cited by examiner

MICROPHONE ASSEMBLY

CROSS-REFERENCE TO RELATED APPLICATION

The present application claims priority under 35 U.S.C. § 119 of Japanese Patent Application No. 2017-162257 filed on Aug. 25, 2017, the disclosure of which is expressly incorporated by reference herein in its entirety.

BACKGROUND OF THE INVENTION

Technical Field
The invention relates to microphone assemblies.
Background Art
Japanese Patent Application Laid-Open No. 2010-62800 discloses a conventional microphone assembly. The assembly includes a microphone, a soundproof member, a connection cable, a circuit board, a holding case, and a terminal. The microphone is held inside the soundproof member. The holding case is provided with a fitting recess. The fitting recess of the holding case fittingly receives the circuit board and the soundproof member in in this order. The circuit board and the microphone are interconnected via the connection cable inside the fitting recess. In a portion of the holding case above the fitting recess, there are provided a first connection hole, a second connection hole, and a partition wall therebetween. The first connection hole extends and opens to one side of a direction (orthogonal direction) that is orthogonal to the direction in which the microphone fits in the fitting recess, and the second connection hole extends and opens to the other side of the orthogonal direction. The terminal penetrates the partition wall in the orthogonal direction and includes a first end in the first connection hole and a second end in the second connection hole.

The first connection hole and the first end of the terminal constitute a first connection part of the microphone assembly, and the second connection hole and the second end of the terminal constitute a second connection part of the microphone assembly. A vehicle-side connector can be connected to one of the first and second connection parts. In other words, the vehicle-side connector can be connected to the first connection part of the microphone assembly from the one side of the orthogonal direction or to the second connection part of the microphone assembly from the other side of the orthogonal direction.

SUMMARY OF INVENTION

Requiring the connection cable to interconnect the microphone and the circuit board, the microphone assembly has an increased number of components. Also, as the microphone, together with the soundproof member, is fitted in the fitting recess of the holding case and connected to the circuit board in the fitting recess, this arrangement the orientation and position of the microphone is determined with respect to the holding case and the circuit board. In other words, it is not possible to change the orientation and position of the microphone with respect to the holding case and the circuit board.

The invention provides a microphone assembly that has a reduced number of components and is mountable in various orientations and/or positions relative to the main board.

A microphone assembly of an aspect of the invention includes a main board and a microphone. The microphone includes a capacitor or a MEMS chip, a case accommodating the capacitor or the MEMS chip, and a microphone board electrically connected to the capacitor or the MEMS chip. The microphone board has a larger outer dimension than the case and includes a fixing portion and a connecting portion. The case is fixed onto the fixing portion. The connecting portion is a portion of the microphone board, the portion being located outside the case and electrically and mechanically connected to the main board. The microphone assembly of this aspect has a reduced number of components because the connecting portion of the microphone board of the microphone is electrically and mechanically connected directly to the main board. Such direct electrical and mechanical connection also makes it possible to suitably change the orientation and/or the position of the microphone relative to the main board connected to the microphone.

The main board may include a first face, a second face on an opposite side to the first face, and a connection hole in the first or second face. The connection hole may be a though-hole extending from the first face to the second face of the main board, or alternatively be a bottomed hole. The connecting portion of the microphone board may be received in the connection hole of the main board and electrically and mechanically connected to the main board. The microphone board may be disposed such as at least partly extend perpendicularly or obliquely to the first or second face of the main board. The microphone assembly of this aspect is adapted for a simplified mechanical connection of the microphone board to the main board. This is because the connecting portion is connected at least mechanically to the main board by inserting the connecting portion into the connection hole. It is also possible to change the orientation and/or the position of the connecting portion of the microphone board relative to the main board connected to the connecting portion by changing the orientation and/or the position of the connection hole.

The connection hole of the main board may include a first connection hole and a second connection hole. The connecting portion of the microphone board of the microphone may include a first end portion, a second end portion, a first electrode, and a second electrode. The first end portion may be received in the first connection hole and include a first face and a second face on an opposite side to the first face of the first end portion. The second end portion may be received in the second connection hole and include a first face and a second face on an opposite side to the first face of the second end portion. The first electrode may be provided on at least one of the first and second faces of the first end portion, and electrically and mechanically connected to the main board with the first end portion received in the first connection hole. The second electrode may be provided on at least one of the first and second faces of the second end portion, and electrically and mechanically connected to the main board with the second end portion received in the second connection hole. The microphone assembly of this aspect provides an improved connection strength of the microphone board to the main board. This is because the first and second electrodes of the first and second end portions are electrically and mechanically connected to the main board with the first and second end portions received in the first and second connection holes of the main board.

The first connection hole and the second connection hole may pass through the main board from the first face to the second face of the main board, and each of the first connection hole and the second connection hole may have a first opening and a second opening on an opposite side to the first opening. The first end portion may be received in, and pass through, the first connection hole. The second end portion may be received in, and pass through, the second connection hole. The first electrode may include a first exposed portion, a second exposed portion, and an intermediate portion. In the first electrode, the first exposed portion may be exposed to an outside through the first opening of the first connection hole and electrically and mechanically connected to the main board; the second exposed portion may be exposed to the outside through the second opening of the first connection hole and electrically and mechanically connected to the main board; and the intermediate portion may be located in the first connection hole and may interconnect the first exposed portion and the second exposed portion of the first electrode. The second electrode may include a first exposed portion, a second exposed portion, and an intermediate portion. In the second electrode, the first exposed portion may be exposed to the outside through the first opening of the second connection hole and electrically and mechanically connected to the main board; the second exposed portion may be exposed to the outside through the second opening of the second connection hole and electrically and mechanically connected to the main board; and the intermediate portion may be located in the second connection hole and may interconnect the first exposed portion and the second exposed portion of the second electrode.

The microphone assembly of this aspect provides a further improved connection strength of the microphone board to the main board. This is because the first and second exposed portions of the first electrode of the first end portion and the first and second exposed portions of the second electrode of the second end portion are electrically and mechanically connected to the main board.

A plurality of the first electrodes may be provided on the first and second faces of the first end portion. A plurality of the second electrodes may be provided on the first and second faces of the second end portion. The microphone assembly of this aspect provides a further improved connection strength of the microphone board to the main board. This is because the first and second exposed portions of the first electrodes on the first end portion and the first and second exposed portions of the second electrodes on the second end portion are electrically and mechanically connected to the main board.

The connecting portion of the microphone board of the microphone may further include an abutment between the first end portion and the second end portion. The abutment may abut the first or second face of the main board. The microphone assembly of this aspect provides a stable mechanical connection of the microphone board to the first or second face of the main board. This is because the abutment abuts the first or second face of the main board with the first and second end portions received in the first and second connection holes, respectively.

The connecting portion of the microphone board may include one of the first and second end portions of any of the above aspects, and an abutment.

The microphone assembly according to any of the above aspects may further include a holder on the first or second face of the main board. The holder may include an accommodation space to accommodate the microphone. The microphone board of the microphone may partition the accommodation space into a front chamber and a rear chamber. The microphone assembly of this aspect does not require a separate member to partition the accommodation space into the front chamber and the rear chamber, reducing the number of the components of the of the microphone assembly.

The holder may further include a holding portion. The holding portion may hold the microphone board, with the microphone board at least partly extending perpendicularly or obliquely to the first or second face of the main board. In the microphone assembly of this aspect, the microphone board is stably held as at least partly oriented perpendicularly or obliquely to the first or second face of the main board.

The fixing portion of the microphone board may include a first face, a second face on an opposite side to the first face of the fixing portion, and a nonconductive insertion hole. The insertion hole may extend through the fixing portion from the first face of the fixing portion to the second face of the fixing portion. The case of the microphone may include a leg. The leg may pass through the insertion hole from the first face side of the fixing portion and may be fixed to the second face of the fixing portion by soldering. In the microphone assembly of this aspect, solder and flux are unlikely to enter into the case.

The microphone board may further include a ground conductor of loop shape and a conductive adhesive portion of loop shape. The ground conductor may be provided on the microphone board such as to be located around, and in spaced relation to the case. The conductive adhesive portion may be provided in a region on the microphone board between the case and the ground conductor. The microphone assembly of this aspect has no clearance between the case and the ground conductor, reducing the possibility that induced noise occurs between the case and the ground conductor.

BRIEF DESCRIPTION OF DRAWINGS

The present invention can be even more fully understood with the reference to the accompanying drawings which are intended to illustrate, not limit, the present invention.

DESCRIPTION OF EMBODIMENTS

The following describes embodiments of the invention.
First Embodiment

Figure 1A:
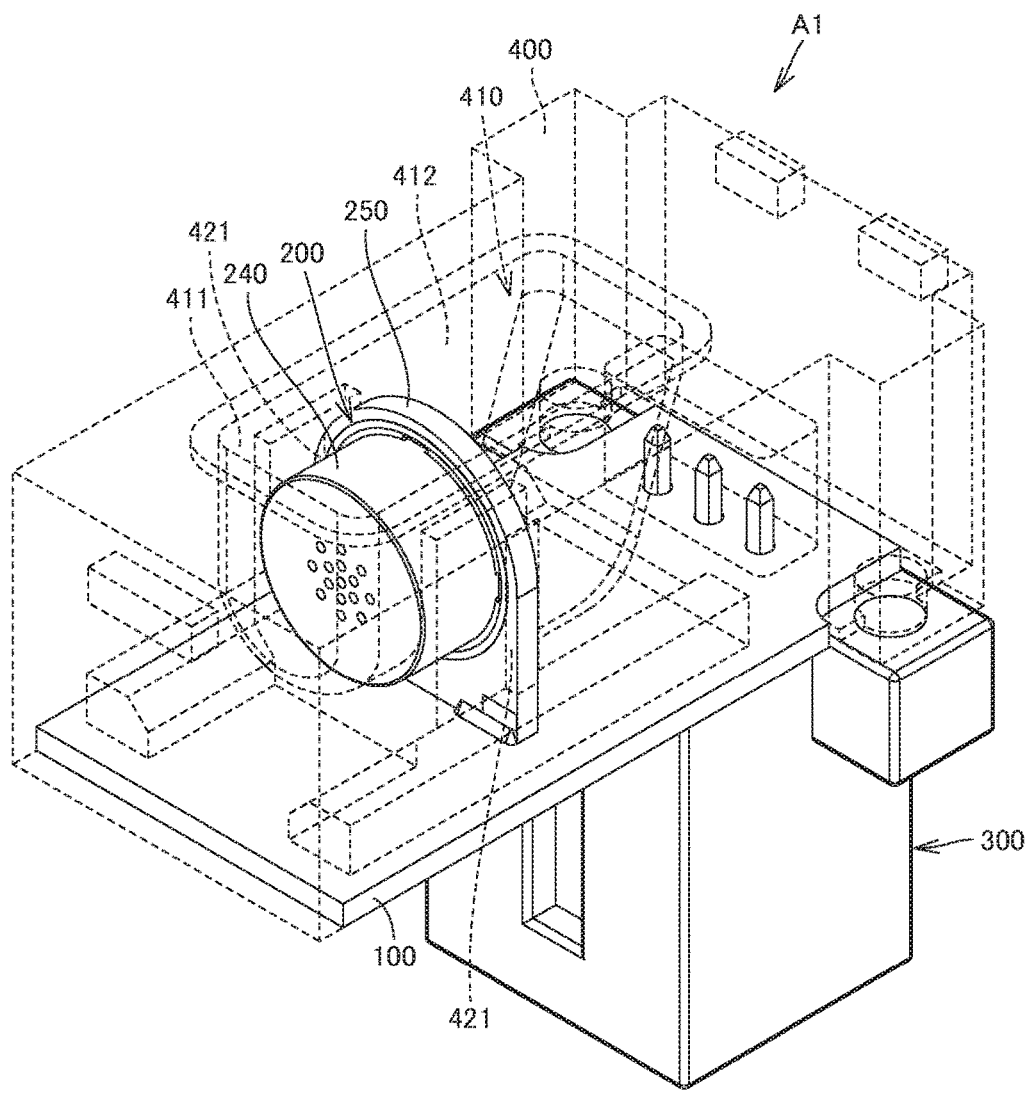
FIG. 1A is a front, top, and right-side perspective view of a microphone assembly according to a first embodiment of the invention.
Figure 1B:
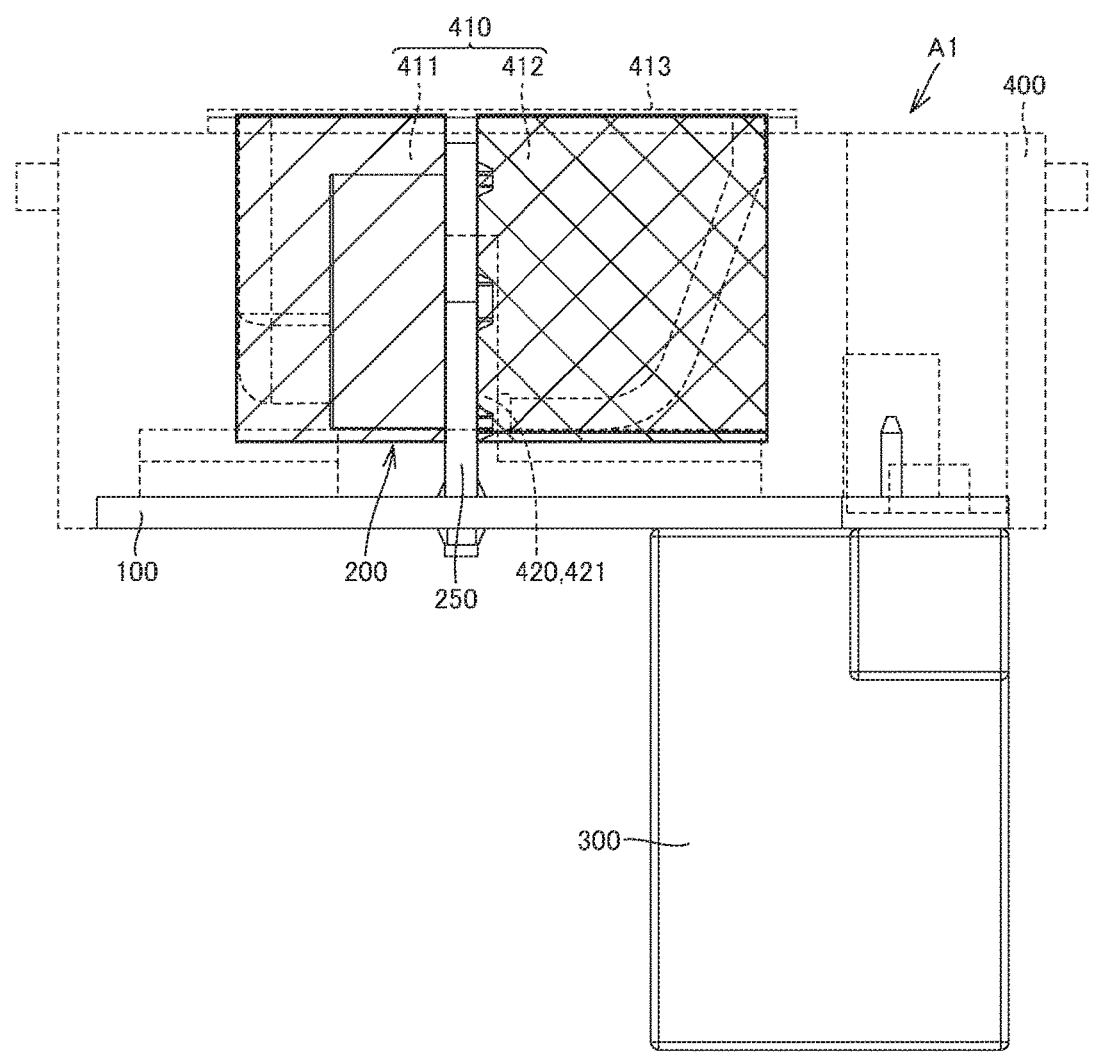
FIG. 1B is a right-side view of the microphone assembly.
Figure 2A:
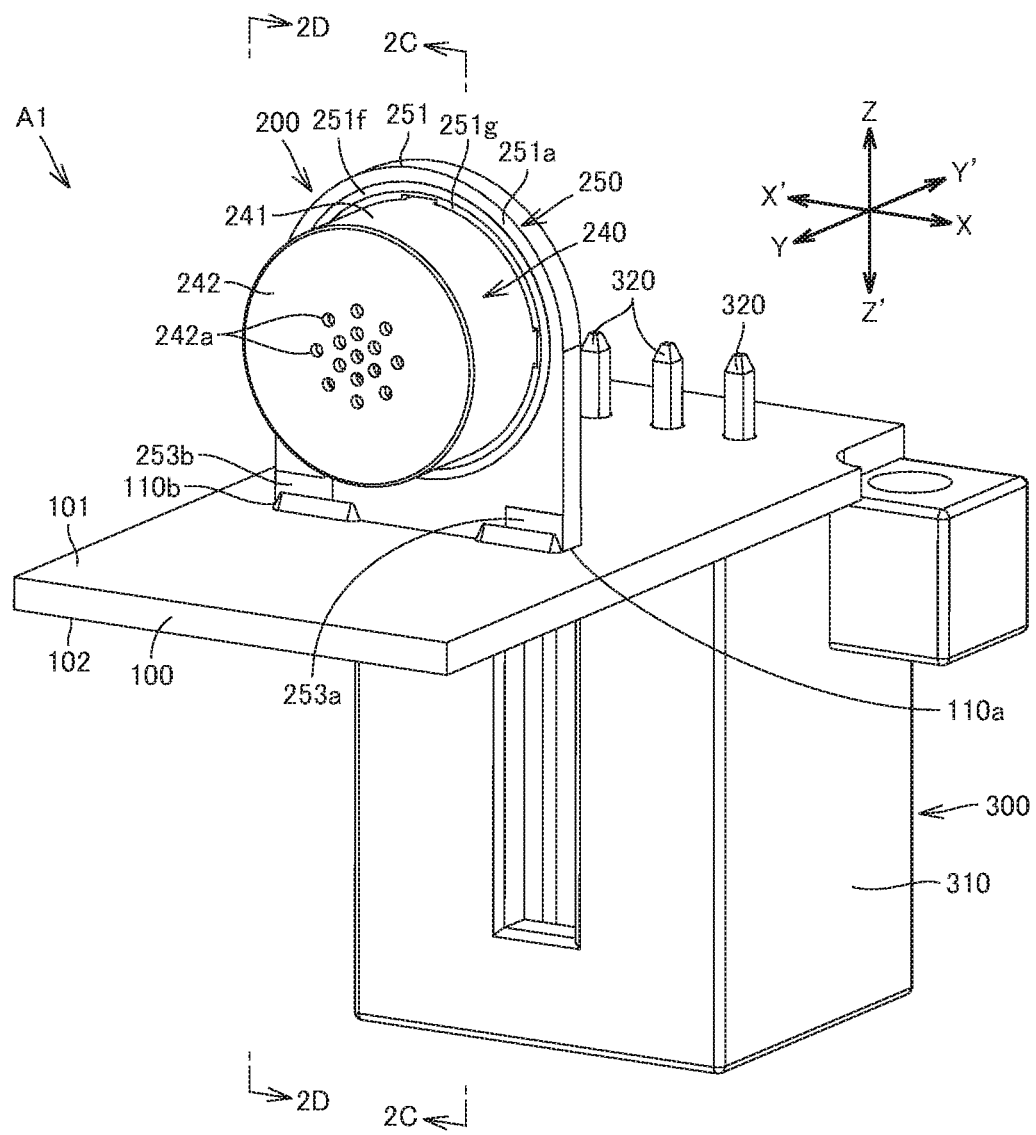
FIG. 2A is a front, top, and right-side perspective view of a microphone, a main board, and an external connection of the microphone assembly.
Figure 2B:
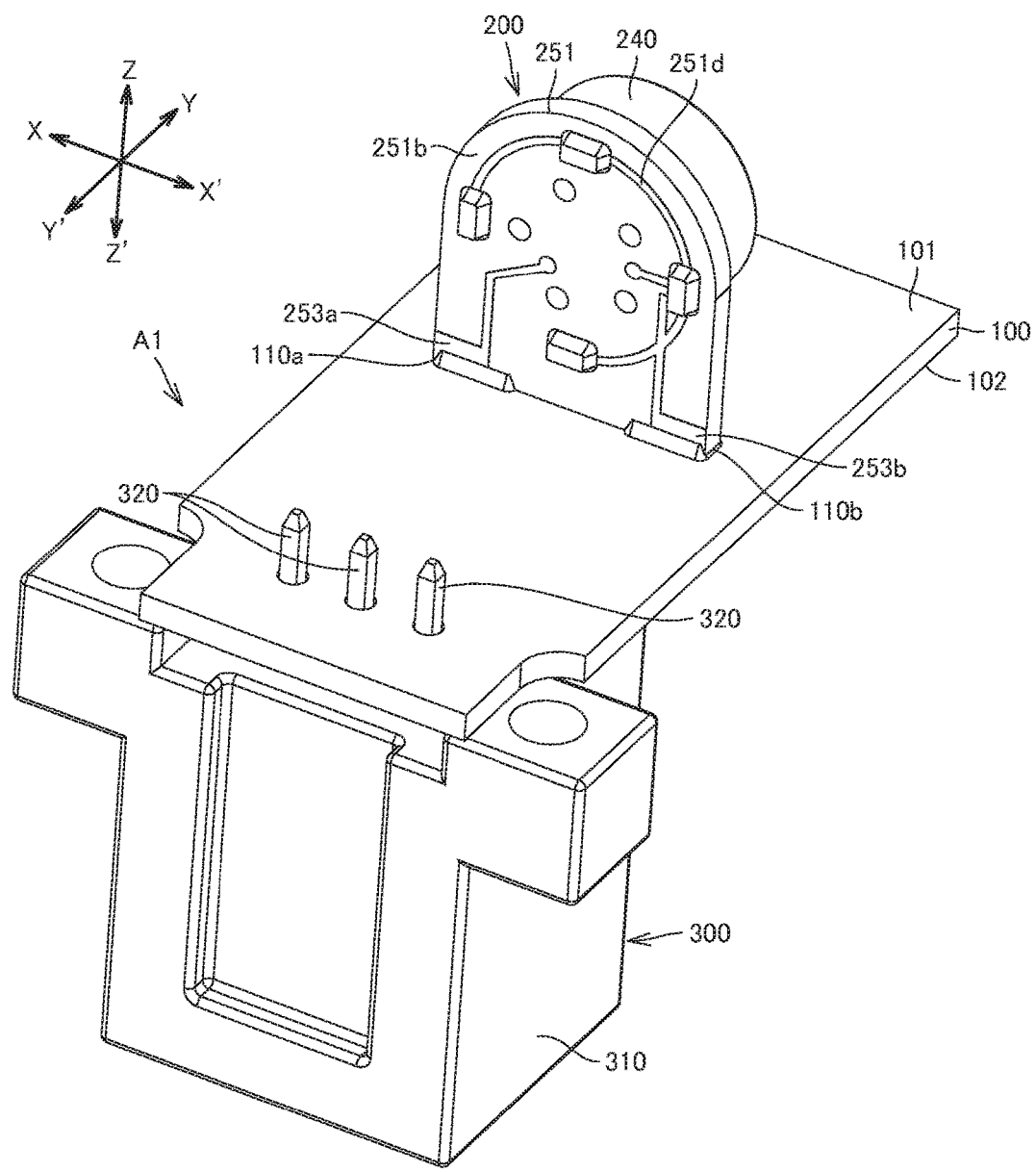
FIG. 2B is a rear, top, and left side perspective view of the microphone, the main board, and the external connection of the microphone assembly.

We now describe a microphone assembly A1 (hereinafter also referred to simply as an assembly A1) according to various embodiments including a first embodiment of the invention, with reference to FIGS. 1A to 3E. FIGS. 1A to 3E shows an assembly A1 of the first embodiment. The Z-Z' direction, indicated in FIGS. 1A to 2D, is the thickness direction of a main board 100 of the assembly A1 and includes a Z direction and a Z' direction. The Y-Y' direction, indicated in FIGS. 1A to 2D, is orthogonal to the Z-Z' direction. The X-X' direction, indicated in FIGS. 1A and 2A to 2B, is orthogonal to the Z-Z' and Y-Y' directions.

The assembly A1 includes the main board 100. The main board 100 is a circuit board including a first face 101 on the Z-direction side and a second face 102 on the Z'-direction side.

The assembly A1 further includes a microphone 200. The microphone 200 includes a diaphragm 211, a fixed electrode 212, a ring 220, a spacer 230, a case 240 having electrical conductivity, and a microphone board 250 (see FIG. 3E).

The case 240 may include a tube 241 and a closing plate 242 as shown in FIGS. 3A to 3E. The tube 241 has first and second openings, and the closing plate 242 closes the first opening of the tube 241. Alternatively, the case 240 may include the tube 241 but not a closing plate 242. In either case, the case 240 accommodates the diaphragm 211, the fixed electrode 212, the ring 220, and the spacer 230 (see FIGS. 3C and 3D). The diaphragm 211 is attached to the ring 220. The ring 220 is in contact with the closing plate 242 of the case 240, and the diaphragm 211 is electrically connected to the case 240 via the ring 220. The closing plate 242 is provided with at least one sound hole 242a. The fixed electrode 212 faces the diaphragm 211 with a clearance therebetween. The diaphragm 211 and the fixed electrode 212 constitute a capacitor 210. The diaphragm 211 and the fixed electrode 212 are accommodated in the case 240 as described above, which means that the capacitor 210 is accommodated in the case 240. The spacer 230 has a ring shape and is interposed between the diaphragm 211 and the fixed electrode 212. The spacer 230 can be omitted in the case where the ring 220 and the fixed electrode 212 are fixed inside the case 240 leaving a clearance between the diaphragm 211 and the fixed electrode 212.

The microphone board 250 is a well-known circuit board, such as a rigid board (see FIGS. 1A to 2D), a flexible board, or a rigid flexible board. The microphone board 250 has a larger outer dimension in the plane direction of the microphone board 250 than the tube 241 of the case 240. The microphone board 250 may preferably, but is not required to, have a thickness dimension of at least 1 mm. The microphone board 250 includes a fixing portion 251. The tube 241 of the case 240 is fixed to the fixing portion 251, and the second opening of the tube 241 is closed with the fixing portion 251. The case 240 may be fixed to the fixing portion 251 in one of the following manners (1) to (3), for example:

(1) The fixing portion 251 includes a first face 251a, a second face 251b opposite to the first face 251a, at least one insertion hole 251c, and a connection conductor 251d on the second face 215b. The at least one insertion hole 251c is a nonconductive hole and extends through the fixing portion 251 from the first face 251a to the second face 251b. The tube 241 of the case 240 abuts the first face 251a of the fixing portion 251. The case 240 further includes at least one leg 243. The or each leg 243 extends from the tube 241 and passes through a corresponding insertion hole 251c from the first face 251a side of the fixing portion 251. The at least one leg 243 is electrically and mechanically connected to the connection conductor 251d on the second face 251b of the fixing portion 251 by soldering or welding, or with a conductive adhesive or the like (see FIGS. 3C and 3D). If the at least one leg 243 is connected to the connection conductor 251d by soldering, solder and flux are unlikely to enter into the case 240. The or each leg 243 of the tube 241 may be fittingly received in the corresponding insertion hole 251c of the fixing portion 251.

(2) The or each insertion hole 251c of the fixing portion 251 is a bottomed hole and receives or fittingly receives the corresponding leg 243. In this case, the connection conductor 251d is provided, not on the second face 251b, but on the first face 251a, and electrically connected to the tube 241 of the case 240.

(3) The tube 241 of the case 240 abuts the first face 251a of the fixing portion 251 and is electrically and mechanically connected to the connection conductor 251d on the first face 251a by soldering or welding, or with a conductive adhesive or the like. In this case, the leg 243 and the insertion hole 251c are omitted.

The or each insertion hole 251c may be a via-hole electrode.

Figure 3A:
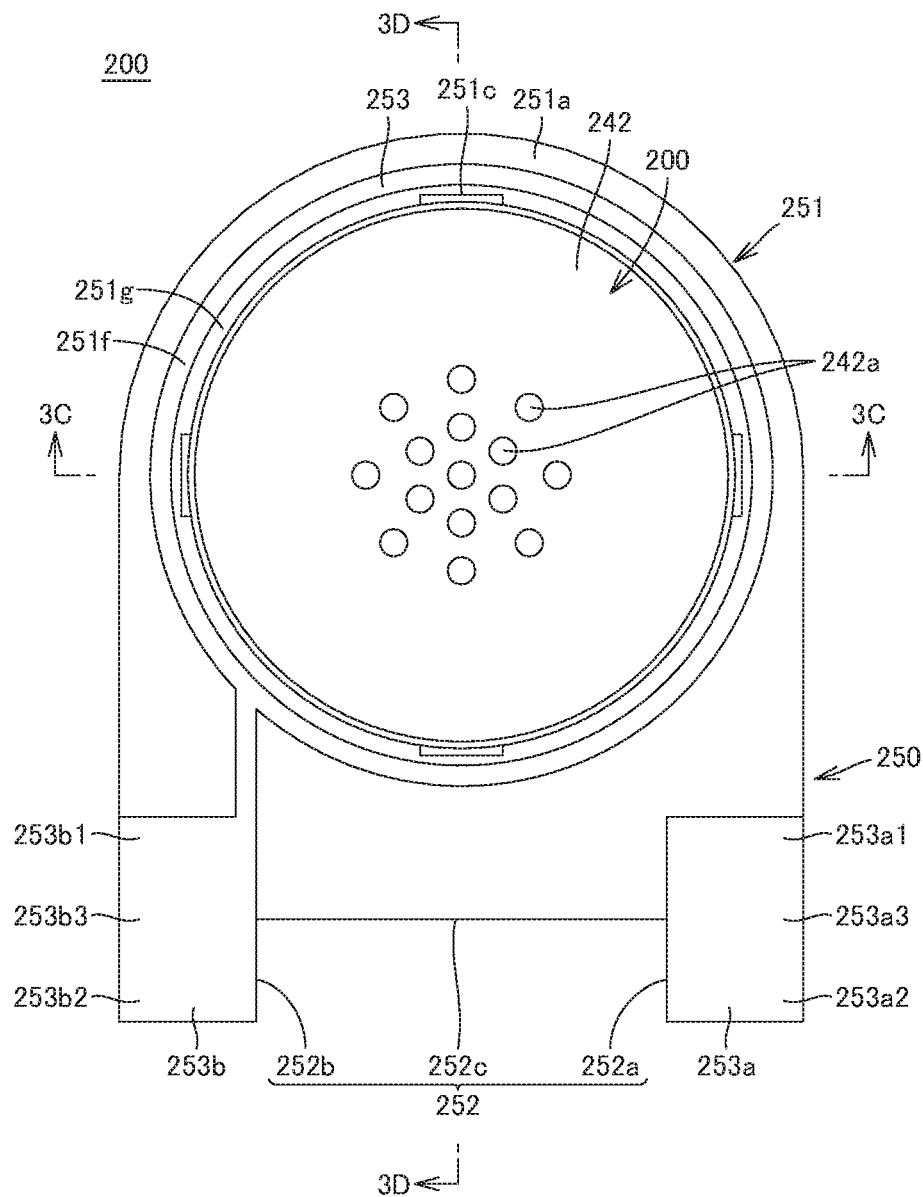
FIG. 3A is an enlarged front view of the microphone of the microphone assembly.
Figure 3B:
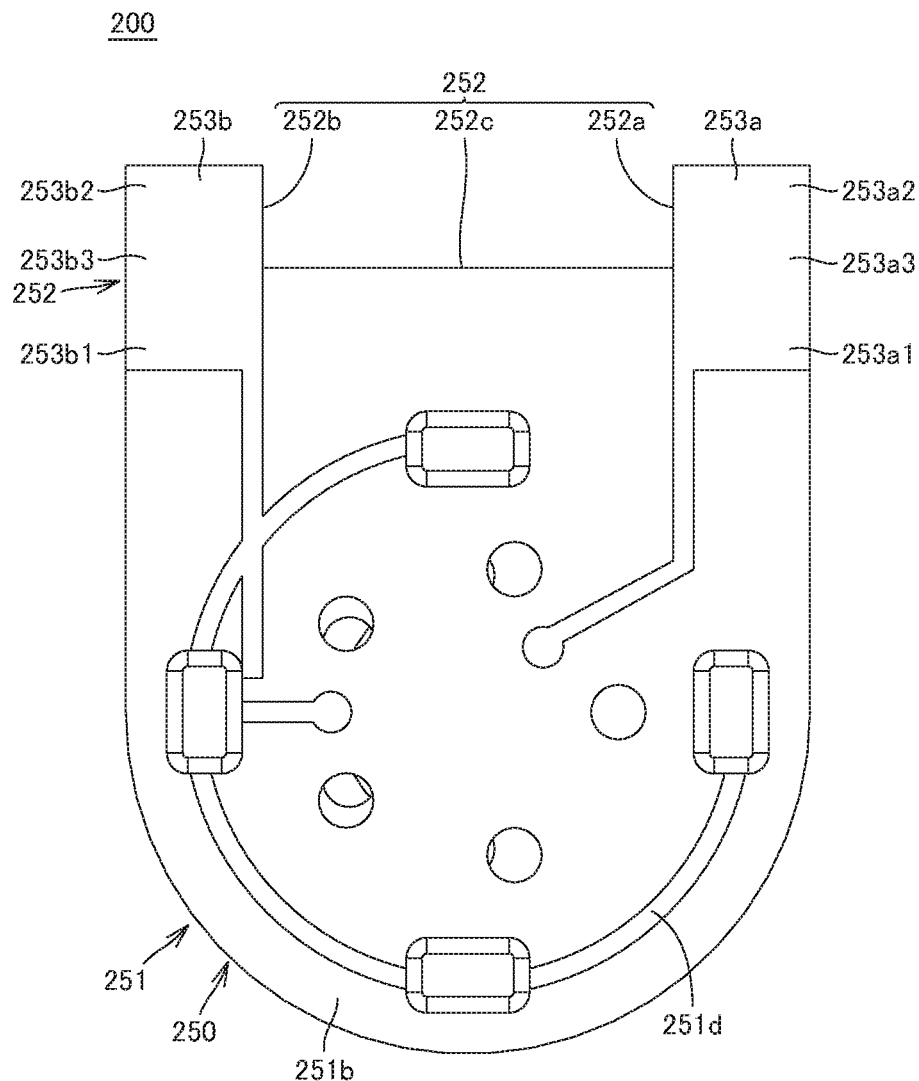
FIG. 3B is an enlarged rear view of the microphone of the microphone assembly.
Figure 3C:
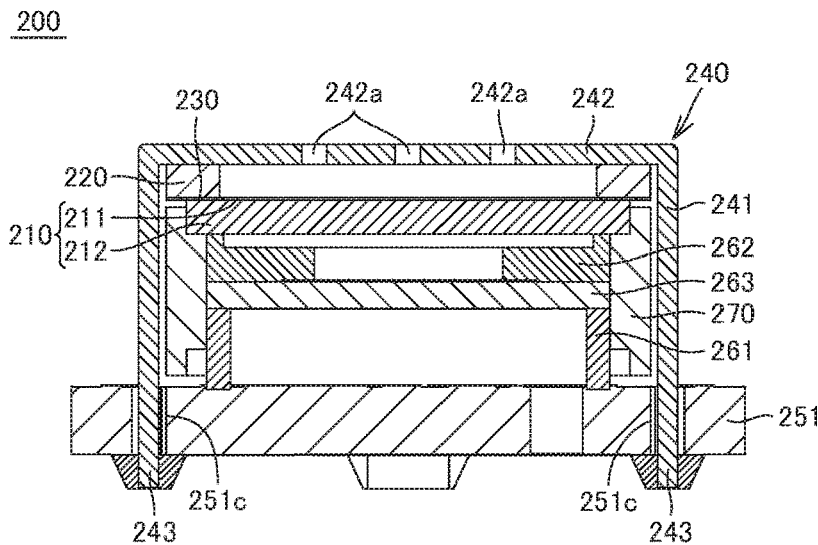
FIG. 3C is a sectional view of the microphone of the microphone assembly, taken along line 3C-3C in FIG. 3A.
Figure 3D:
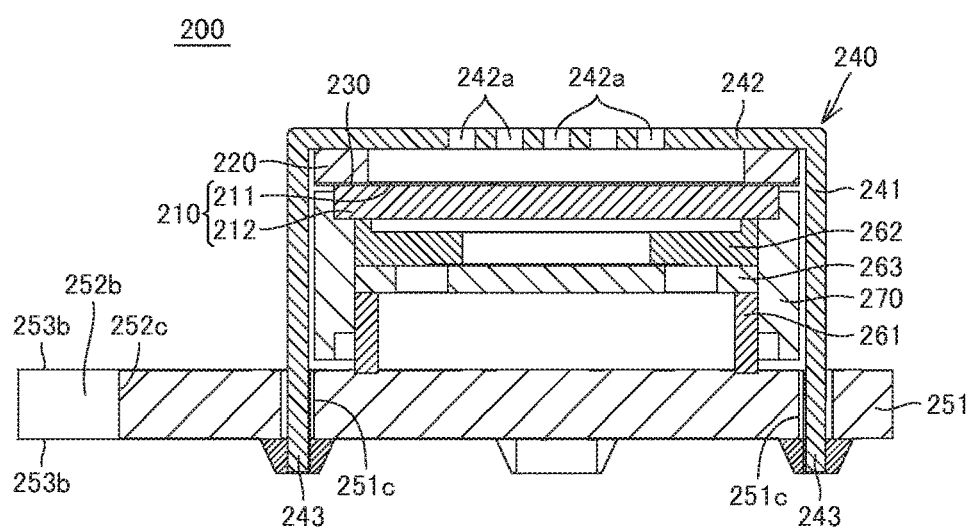
FIG. 3D is a sectional view of the microphone of the microphone assembly, taken along line 3D-3D in FIG. 3A.
Figure 3E:
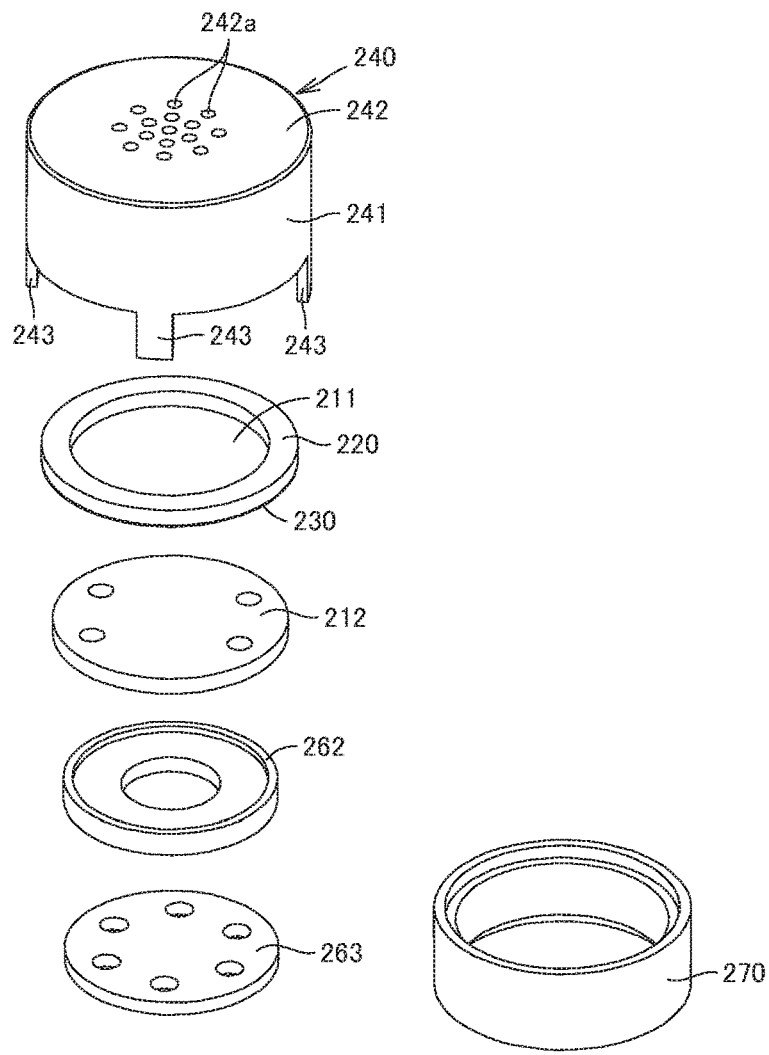
FIG. 3E is an exploded perspective view of the microphone of the microphone assembly.
Figure 3E:
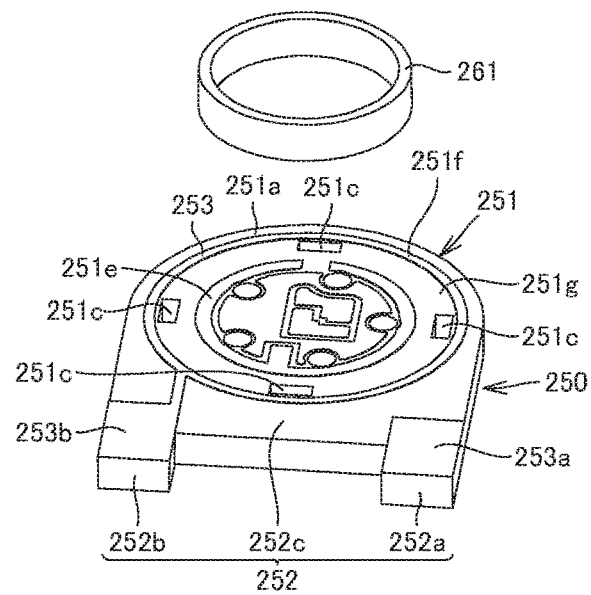

The microphone 200 further includes at least one conductive member. The at least one conductive member is interposed between the first face 251a of the fixing portion 251 and the fixed electrode 212 so as to electrically interconnect a connection conductor 251e of the fixing portion 251 and the fixed electrode 212 (see FIGS. 3C and 3D). The connection conductor 251e is provided on the first face 251a of the fixing portion 251 (see FIG. 3E). The at least one conductive member is, for example, a gate ring 261, an acoustic resistance ring 262, and/or an acoustic resistance plate 263. Referring to FIGS. 3C to 3E, the gate ring 261, the acoustic resistance ring 262, and the acoustic resistance plate 263 are interposed between the first face 251a of the fixing portion 251 and the fixed electrode 212 so as to electrically interconnect the connection conductor 251e of the fixing portion 251 and the fixed electrode 212. More specifically, the gate ring 261 is in contact with the connection conductor 251e, the acoustic resistance ring 262 is in contact with the fixed electrode 212, and the acoustic resistance plate 263 is interposed between the gate ring 261 and the acoustic resistance ring 262.

The microphone 200 may further include an insulator 270 as illustrated in FIGS. 3C to 3E. The insulator 270 is a loop-shaped body interposed between the case 240 and the gate ring 261 so as to prevent contact between the case 240 and the gate ring 261. The insulator 270 holds the fixed electrode 212. The insulator 270 may be omitted in the case where the ring 220, the diaphragm 211, the spacer 230, the fixed electrode 212, and the at least one conductive member are interposed between the closing plate 242 of the case 240 and the fixing portion 251 and thereby held inside the case 240.

If the case 240 includes the closing plate 242, the closing plate 242 may function as a fixed electrode. In this case, the microphone 200 may have the following configuration. The fixed electrode 212 is omitted. The diaphragm 211 and the ring 220 are disposed such that the diaphragm 211 faces the closing plate 242 with a clearance therebetween, and the capacitor 210 is constitutes by the diaphragm 211 and the closing plate 242 (fixed electrode). In this case, the fixed electrode is electrically connected to the case 240, and the at least one conductive member is interposed between the ring 220 and the fixing portion 251 so as to electrically interconnect the connection conductor 251e of the fixing portion 251 and the diaphragm 211.

If the case 240 includes the tube 241 but does not include a closing plate 242, the fixed electrode 212 may close the first opening of the tube 241. In this case, the fixed electrode 212 is in contact with the tube 241 of the case 240 and electrically connected to the case 240, the diaphragm 211 and the ring 220 are disposed such that the diaphragm 211 faces the fixed electrode 212 with a clearance therebetween, and the at least one conductive member is interposed between the ring 220 and the fixing portion 251 so as to electrically interconnect the connection conductor 251e of the fixing portion 251 and the diaphragm 211.

In the invention, the capacitor 210 is accommodated in the case 240 either in the case where the closing plate 242 of the case 240 functions as the fixed electrode or the case where the fixed electrode 212 closes the first opening of the tube 241.

For convenience of explanation, with regard to the microphone 200 of any of the above aspects, the case 240 and the components accommodated therein will be hereinafter referred to also as a microphone body.

The fixing portion 251 of the microphone board 250 may further include a ground conductor 251f of loop shape and a conductive adhesive 251g of loop shape. The ground conductor 251f is provided on the first face 251a of the fixing portion 251 such as to be located around, and in spaced relation to, the case 240. The conductive adhesive 251g is provided in a region of the first face 251a of the fixing portion 251 between the case 240 and the ground conductor 251f. The conductive adhesive 251g interconnects the case 240 and the ground conductor 251f. The ground conductor 251f and/or the conductive adhesive 251g may be omitted.

The microphone board 250 further includes a connecting portion 252. The connecting portion 252 is a portion of the microphone board 250, the portion being located outside the case 240. The connecting portion 252 is electrically and mechanically connected to the main board 100 such that the microphone board 250 at least partly extend perpendicularly or obliquely to the first face 101 or the second face 102 of the main board 100. The connecting portion 252 and the main board 100 may be more specifically configured and arranged as follows.

Figure 2C:
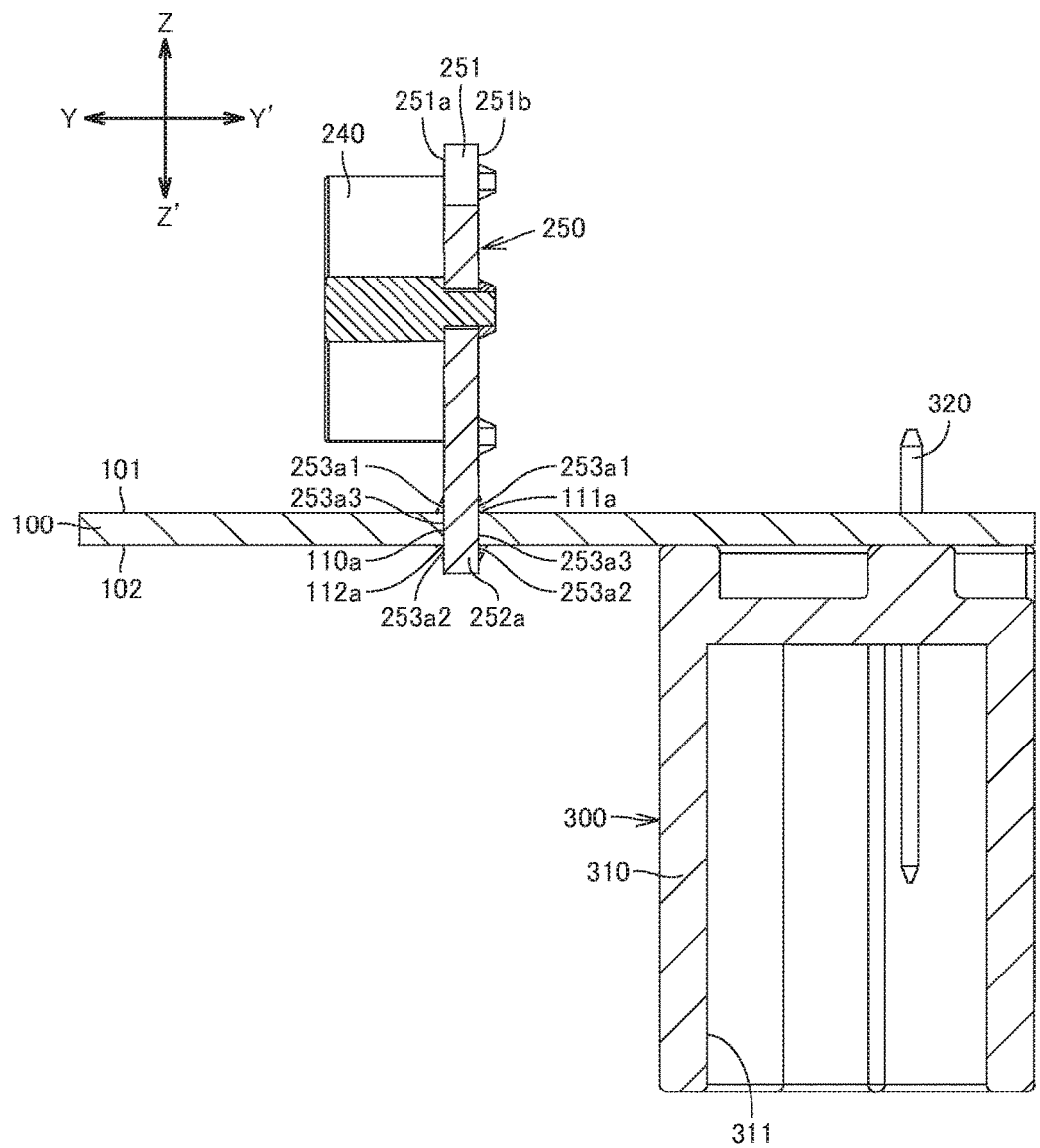
FIG. 2C is a sectional view of the microphone and the main board of the microphone assembly, taken along line 2C-2C in FIG. 2A.
Figure 2D:
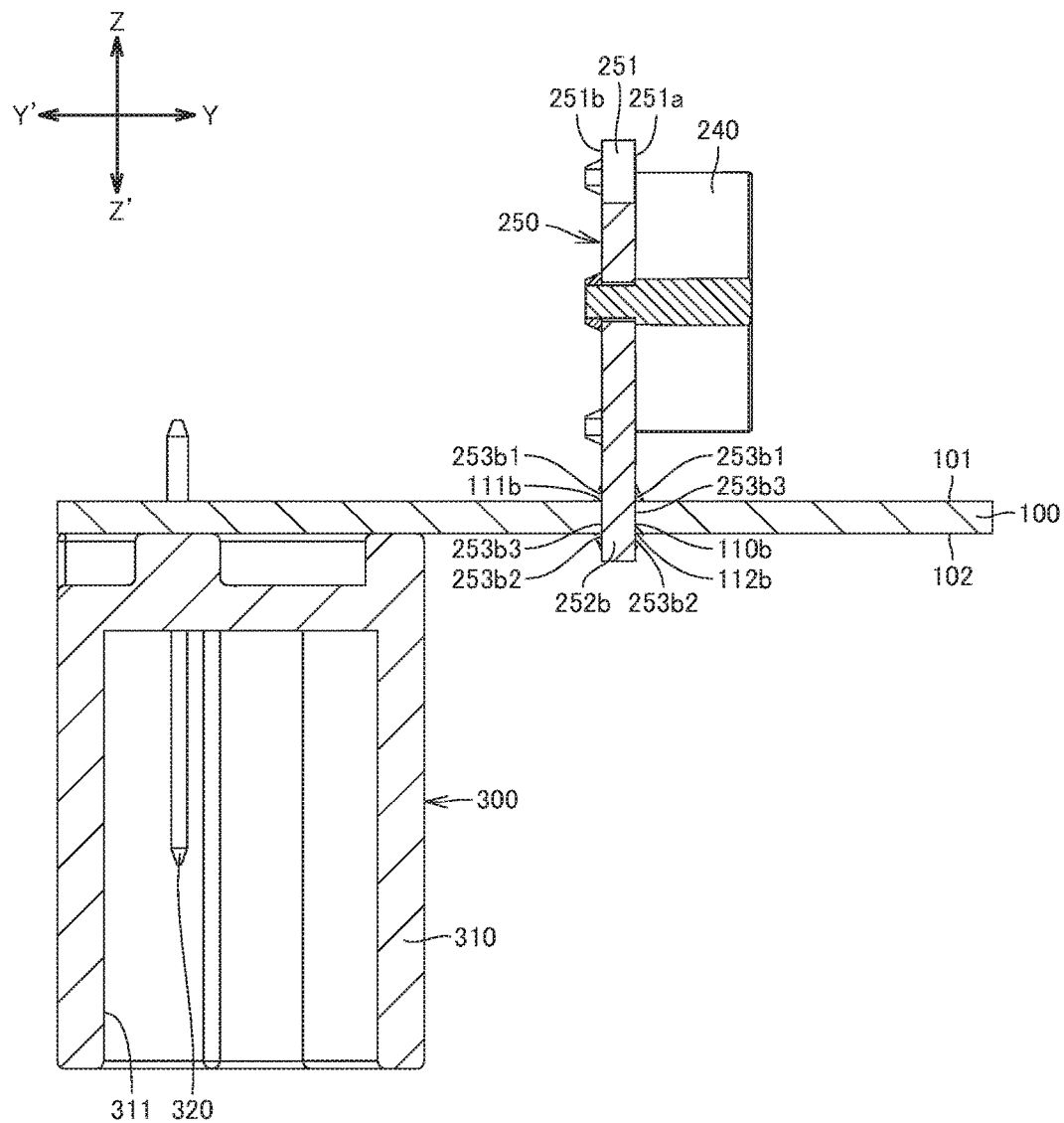
FIG. 2D is a sectional view of the microphone and the main board of the microphone assembly, taken along line 2D-2D in FIG. 2A.

The main board 100 further includes a first connection hole 110a and a second connection hole 110b, which may be via-hole electrodes extending through the main board 100 from the first face 101 to the second face 102 (see FIGS. 2C and 2D). The first connection hole 110a and the second connection hole 110b may be spaced from each other in the X-X' direction (see FIGS. 2A and 2B), in the Y-Y' direction, or in an oblique direction including components of the X-X' and Y-Y' directions. The first connection hole 110a has an opening 111a on the Z-direction side and an opening 112a on the opposite side (Z'-direction side). The second connection hole 110b has an opening 111b on the Z-direction side and an opening 112b on the opposite side (Z'-direction side).

The connecting portion 252 includes a first end portion 252a, a second end portion 252b, at least one first electrode 253a, and at least one second electrode 253b. The first end portion 252a and the second end portion 252b each have first and second faces opposite to each other. The first end portion 252a and the second end portion 252b are respectively received in the first connection hole 110a and the second connection hole 110b through the opening 111a and the opening 111b, or alternatively through the opening 112a and the opening 112b. The or each first electrode 253a is provided on the first or second face of the first end portion 252a, and electrically and mechanically connected to the first connection hole 110a by soldering or welding, or with a conductive adhesive, with the first end portion 252a received in the first connection hole 110a. The at least one first electrode 253a is thus connected via a first conductive line of the microphone board 250 to the connection conductor 251e of the fixing portion 251 of any of the above aspects. The or each second electrode 253b is provided on the first or second face of the second end portion 252b, and electrically and mechanically connected to the second connection hole 110b by soldering, welding, or with a conductive adhesive, with the second end portion 252b received in the second connection hole 110b. The or each second electrode 253b is thus connected via a second conductive line of the microphone board 250 to the connection conductor 251d or the ground conductor 251f of the fixing portion 251 of any of the above aspects.

In FIGS. 1A to 3E, a plurality of first electrodes 253a are provided on the first and second faces of the first end portion 252a, and a plurality of second electrodes 253b are provided on the first and second faces of the second end portion 252b. The first electrode 253a on the first face of the first end portion 252a is electrically floating, while the first electrode 253a on the second face of the first end portion 252a is electrically connected via the first conductive line to the connection conductor 251e on the second face 251b of the fixing portion 251. The second electrode 253b on the first face of the second end portion 252b is electrically connected via one of the second conductive lines to the ground conductor 251f on the first face 251a of the fixing portion 251, while the second electrode 253b on the second face of the second end portion 252b is electrically connected via the other second conductive line to the connection conductor 251d on the second face 251b of the fixing portion 251.

The first end portion 252a may extend through the first connection hole 110a, and the second end portion 252b may extend through the second connection hole 110b (see FIGS. 3A to 3D). In this case, it is preferable that the or each first electrode 253a include a first exposed portion 253a1, a second exposed portion 253a2, and an intermediate portion 253a3, and that the or each second electrode 253b include a first exposed portion 253b1, a second exposed portion 253b2, and an intermediate portion 253b3.

In case (1) where the first end portion 252a extends through the first connection hole 110a from the opening 111a side while the second end portion 252b extends through the second connection hole 110b from the opening 111b side, the first exposed portion 253a1 of the or each first electrode 253a is exposed to the outside through the opening 111a of the first connection hole 110a (corresponding to the first opening of the first connection hole in the claims), and electrically and mechanically connected to the first connection hole 110a by soldering or welding, or with a conductive adhesive. The second exposed portion 253a2 of the or each first electrode 253a is exposed to the outside through the opening 112a of the first connection hole 110a (corresponding to the second opening of the first connection hole in the claims), and electrically and mechanically connected to the first connection hole 110a by soldering, welding, or with a conductive adhesive. The first exposed portion 253b1 of the or each second electrode 253b is exposed to the outside through the opening 111b of the second connection hole 110b (corresponding to the first opening of the second connection hole in the claims), and electrically and mechanically connected to the second connection hole 110b by soldering or welding, or with a conductive adhesive. The second exposed portion 253b2 of the or each second electrode 253b is exposed to the outside through the opening 112b of the second connection hole 110b (corresponding to the second opening of the second connection hole in the claims), and electrically and mechanically connected to the second connection hole 110b by soldering or welding, or with a conductive adhesive.

In case (2) where the first end portion 252a extends through the first connection hole 110a from the opening 112a side while the second end portion 252b extends through the second connection hole 110b from the opening 112b side, the first exposed portion 253a1 of the or each first electrode 253a is exposed to the outside through the opening 112a of the first connection hole 110a (corresponding to the first opening of the first connection hole in the claims), and electrically and mechanically connected to the first connection hole 110a by soldering or welding, or with a conductive adhesive. The second exposed portion 253a2 of the or each first electrode 253a is exposed to the outside through the opening 111a of the first connection hole 110a (corresponding to the second opening of the first connection hole in the claims), and electrically and mechanically connected to the first connection hole 110a by soldering, welding, or with a conductive adhesive. The first exposed portion 253b1 of the or each second electrode 253b is exposed to the outside through the opening 112b of the second connection hole 110b (corresponding to the first opening of the second connection hole in the claims), and electrically and mechanically connected to the second connection hole 110b by soldering or welding, or with a conductive adhesive. The second exposed portion 253b2 of the or each second electrode 253b is exposed to the outside through the opening 111b of the second connection hole 110b (corresponding to the second opening of the second connection hole in the claims), and electrically and mechanically connected to the second connection hole 110b by soldering or welding, or with a conductive adhesive.

In either case (1) or (2) above, the intermediate portion 253a3 of the or each first electrode 253a is located in the first connection hole 110a and connected to the first exposed portion 253a1 and the second exposed portion 253a2. Also, the intermediate portion 253b3 of the or each second electrode 253b is located in the second connection hole 110b and connected to the first exposed portion 253b1 and the second exposed portion 253b2.

In the case where a single first electrode 253a is provided on the first or second face of the first end portion 252a and a single second electrode 253b is provided on the first or second face of the second end portion 252b, the microphone board 250 is mechanically connected to the main board 100 at four points, namely, the first exposed portion 253a1 of the first electrode 253a, the second exposed portion 253a2 of the first electrode 253a, the first exposed portion 253b1 of the second electrode 253b, and the second exposed portion 253b2 of the second electrode 253b.

In the case where a plurality of first electrodes 253a are provided on the first and second faces of the first end portion 252a and a plurality of second electrodes 253b are provided on the first and second faces of the second end portion 252b, the microphone board 250 is mechanically connected to the main board 100 at eight points, namely, the first exposed portion 253a1 of the first electrode 253a on the first face of the first end portion 252a, the second exposed portion 253a2 of the first electrode 253a on the first face of the first end portion 252a, the first exposed portion 253a1 of the first electrode 253a on the second face of the first end portion 252a, the second exposed portion 253a2 of the first electrode 253a on the second face of the first end portion 252a, the first exposed portion 253b1 of the second electrode 253b on the first face of the second end portion 252b, the second exposed portion 253b2 of the second electrode 253b on the first face of the second end portion 252b, the first exposed portion 253b1 of the second electrode 253b on the second face of the second end portion 252b, and the second exposed portion 253b2 of the second electrode 253b on the second face of the second end portion 252b (see FIGS. 2A to 3E).

The first connection hole 110a of the main board 100 may be a bottomed hole having the opening 111a or 112a and serving as a via-hole electrode. In this case, the first end portion 252a of any of the above aspects is received in the first connection hole 110a, and the at least one first electrode 253a of any of the above aspects is electrically and mechanically connected to the first connection hole 110a by soldering, welding, or with a conductive adhesive.

The second connection hole 110b of the main board 100 may be a bottomed hole having the opening 111b or 112b and serving as a via-hole electrode. In this case, the second end portion 252b of any of the above aspects is received in the second connection hole 110b, and the at least one second electrode 253b of any of the above aspects is electrically and mechanically connected to the second connection hole 110b by soldering, welding, or with a conductive adhesive.

The first connection hole 110a of any of the above aspects may not serve as a via-hole electrode, but just a through-hole or just a bottomed hole having the opening 111a or 112a. In this case, at least one electrode may be provided in the vicinity of the first connection hole 110a on at least one of the first face 101 and the second face 102 of the main board 100. Such at least one electrode may be electrically and mechanically connected to the at least one first electrode 253a of any of the above aspects by soldering, welding, or with a conductive adhesive, with the first end portion 252a of any of the above aspects received in the first connection hole 110a.

Likewise, the second connection hole 110b of any of the above aspects may not serve as a via-hole electrode, but just a through-hole or just a bottomed hole having the opening 111b or 112b. In this case, at least one electrode may be provided in the vicinity of the second connection hole 110b on at least one of the first face 101 and the second face 102 of the main board 100. Such at least one electrode may be electrically and mechanically connected to the at least one second electrode 253b of any of the above aspects by soldering, welding, or with a conductive adhesive, with the second end portion 252b of any of the above aspects received in the second connection hole 110b.

The term "to receive" as used herein should be understood as including "to fittingly receive". Particularly, the first end portion 252a of any of the above aspects may be fittingly received in the first connection hole 110a, and the second end portion 252b of any of the above aspects may be fittingly received in the second connection hole 110b.

In any of the above aspects, in the state where the first end portion 252a and the second end portion 252b are electrically and mechanically connected to the first connection hole 110a and the second connection hole 110b of the main board 100, respectively (hereinafter referred to as a connection state), the microphone board 250 to be fixed to, and arranged perpendicularly or obliquely to, the first face 101 or the second face 102 of the main board 100. If the microphone board 250 is a rigid board, the microphone board 250 stands perpendicularly or obliquely to the first face 101 or the second face 102 of the main board 100 in the connection state (see FIGS. 1A to 2D). If the first connection hole 110a and the second connection hole 110b are spaced from each other in the X-X' direction (see FIGS. 2A and 2B), the case 240 is oriented in the Y or Y' direction with the microphone board 250 standing in the above manner. If the first connection hole 110a and the second connection hole 110b are spaced from each other in the Y-Y' direction, the case 240 is oriented in the X or X' direction with the microphone board 250 standing in the above manner. If the first connection hole 110a and the second connection hole 110b are spaced from each other in the oblique direction including components of the X-X' and Y-Y' directions, the case 240 is oriented to one or the other side of a direction orthogonal to the oblique direction with the microphone board 250 standing in the above manner.

If the microphone board 250 is a flexible board, the connecting portion 252 of the microphone board 250 is perpendicular or oblique to the first face 101 or the second face 102 of the main board 100 in the connection state. If the microphone board 250 is a rigid flexible board and the connecting portion 252 of the microphone board 250 is a rigid portion of the rigid flexible board, the connecting portion 252 stands perpendicularly or obliquely to the first face 101 of the second face 102 of the main board 100 the connection state. If the microphone board 250 is a rigid flexible board and the connecting portion 252 of the microphone board 250 is a flexible portion of the rigid flexible board, the connecting portion 252 is perpendicular or oblique to the first face 101 of the second face 102 of the main board 100 in the connection state.

The connecting portion 252 of any of the above aspects may further include an abutment 252c between the first end portion 252a and the second end portion 252b. Particularly, there is a recess between the first end portion 252a and the second end portion 252b, and the bottom of the recess serves as the abutment 252c. The abutment 252c abuts a portion between the first connection hole 110a and the second connection hole 110b on the first face 101 or the second face 102 of the main board 100. The abutment 252c may be omitted.

The microphone 200 may further include an electronic circuit (not shown), such as a field-effect transistor (FET). The electronic circuit may preferably be mounted on the first face 251a of the fixing portion 251 of the microphone board 250 and accommodated in the case 240. The electronic circuit may be mounted, not on the microphone board 250, but on the main board 100.

The assembly A1 may further include an external connection 300 to interconnect the main board 100 and an external electronic device. For example, the external connection 300 may include a plastic holder 310 and a plurality of terminals 320 or include a flexible board. In the former case, the plastic holder 310 is fixed to one of the first face 101 and the second face 102 of the main board 100. The plastic holder 310 includes a connection hole 311. The terminals 320 are held by the plastic holder 310 inside the connection hole 311, and extend through the main board 100 to be connected to the main board 100.

The assembly A1 may further include a holder 400. If the microphone board 250 is fixed to the first face 101 of the main board 100, the holder 400 is fixed onto the first face 101 of the main board 100. If the microphone board 250 is fixed to the second face 102 of the main board 100, the holder 400 is fixed onto the second face 102 of the main board 100. The holder 400 includes an accommodation space 410. The accommodation space 410 is open to the main board 100 side, from which side the microphone 200 is accommodated in the accommodation space 410. If the holder 400 is fixed onto the first face 101 of the main board 100, the accommodation space 410 may be open in at least one of the X, X', and Z directions. If the holder 400 is fixed onto the second face 102 of the main board 100, the accommodation space 410 may be open in at least one of the X, X', and Z' directions. In either case, it is preferable that the holder 400 further include a cloth 413 to close the opening of the accommodation space 410. The cloth 413 is a nonwoven fabric or other kind of fabric. The microphone board 250 of the microphone 200 may partition the accommodation space 410 into a front chamber 411 and a rear chamber 412 in a direction intersecting the Z-Z' direction, namely in the Y-Y' direction, the X-X' direction, or an oblique direction including components of the X-X' and Y-Y' directions. In this case, the microphone body of the microphone 200 is accommodated in the front chamber 411. For convenience of illustration, FIG. 1B shows the front chamber 411 is marked with oblique lines and the rear chamber 412 is marked with grid lines. However, these lines are not physically present. The cloth 413 is omitted in FIG. 1A.

The front chamber 411 and the rear chamber 412 may partly communicate with each other through a clearance with an arrangement (a) or (b) below, or may be completely separated from each other with one of arrangements (c) to (f).

(a) If the accommodation space 410 is open in the Z direction (see FIG. 1B) or the Z' direction, opposite ends in a direction orthogonal or at an angle to the Z-Z' direction of the microphone board 250 are in abutment with, or embedded in, opposite side walls of the accommodation space 410, leaving a clearance in the Z-Z' direction between the microphone board 250 and the cloth 413.

(b) If the accommodation space 410 is open in the X or X' direction, one of the opposite ends of the microphone board 250 is in abutment with, or embedded in, a side wall in the X' or X direction of the accommodation space 410, and the other end of the microphone board 250 is in abutment with the cloth 413 (which is located on the opposite side to the side wall), leaving a clearance in the Z-Z' direction between the microphone board 250 and a ceiling on the Z or Z'-direction side of the accommodation space 410.

(c) If the accommodation space 410 is open in the Z or Z' direction, the opposite ends of the microphone board 250 are in abutment with, or embedded in, the opposite side walls of the accommodation space 410, and the microphone board 250 is in contact with the cloth 413, leaving no clearance in the Z-Z' direction between the microphone board 250 and the cloth 413.

(d) If the accommodation space 410 is open in the X or X' direction, one of the opposite ends of the microphone board 250 is in abutment with, or embedded in, a side wall in the X' or X direction of the accommodation space 410, and the other end of the microphone board 250 is in abutment with the cloth 413 (which is located on the opposite side to the side wall), leaving no clearance in the Z-Z' direction between the microphone board 250 and the ceiling of the accommodation space 410.

(e) The arrangement (a) is modified such as to include an intermediate member between the microphone board 250 and the cloth 413. The intermediate member fills the clearance between the microphone board 250 and the cloth 413. The intermediate member may be a part of the holder 400 or may be a separate member from the holder 400.

(f) The arrangement (b) is modified such as to include an intermediate member between the microphone board 250 and the ceiling of the accommodation space 410. The intermediate member fills the clearance between the microphone board 250 and the ceiling of the accommodation space 410. The intermediate member may be a part of the holder 400 or may be a separate member from the holder 400.

For the purpose of completely separating the front chamber 411 and the rear chamber 412, it is possible to suitably modify the outer shape of the microphone board 250, the shape of the holder 400, and/or the shape of the intermediate member.

It is also possible to omit the opening of the accommodation space 410 of the holder 400. In this case, the holder 400 may preferably be provided with at least one sound hole (not shown) interconnecting the accommodation space 410 and the outside of the holder 400.

The holder 400 may further have a holding portion 420. The holding portion 420 holds the microphone board 250, with the microphone board 250 at least partly extending perpendicularly or obliquely to the first face 101 or the second face 102 of the main board 100. Specifically, the holding portion 420 includes a pair of slits 421 in the opposite side walls of the accommodation space 410. The slits 421 extend in the Z-Z' direction and are open to the main board 100 side. The slits 421 securely receive the opposite ends of the microphone board 250 from the main board 100 side. In other words, the opposite ends of the microphone board 250 are embedded in the side walls of the holder 400. The holder 400 may be omitted.

The assembly A1 provides the following technical features and effects. Technical feature and effect (1): The assembly A1 can be manufactured with a reduced cost for the following reasons. The assembly A1 has a reduced number of components because the first end portion 252a and the second end portion 252b of the microphone board 250 of the microphone 200 are electrically and mechanically connected directly to the first connection hole 110a and the second connection hole 110b, respectively, of the main board 100. Additionally, such direct electrical and mechanical connection is applicable to automation of the connection process. It is also possible to further reduce the number of components of the assembly A1 if where the assembly A1 includes the holder 400. This is because the microphone board 250 of the microphone 200 partitions the accommodation space 410 into the front chamber 411 and the rear chamber 412, obviating the need to provide a separate member to partition the accommodation space 410 to form the front chamber 411 and the rear chamber 412.

Technical feature and effect (2): It is possible to suitably change the orientation of the microphone 200 within a range of 360° relative to the main board 100, on the first face 101 or the second face 102 of the main board 100. Such change can be realized specifically through changing the orientations of the first connection hole 110a and the second connection hole 110b as described above. It is possible to suitably change the position of the microphone 200 relative to the first face 101 or the second face 102 of the main board 100, by changing the positions of the first connection hole 110a and the second connection hole 110b in the main board 100. With either one of or the combination of the above changes, it is possible to suitably change the orientation and/or position of the microphone 200 relative to the first face 101 or the second face 102 of the main board 100, facilitating the locating of the microphone 200 at an acoustically optimal position.

Technical feature and effect (3): The assembly A1 provides an improved connection strength of the microphone board 250 of the microphone 200 to the main board 100, especially in one of the following cases a) to c):

Case a): The first electrode 253a is provided on the first or second face of the first end portion 252a and the second electrode 253b is provided on the first or second face of the second end portion 252b. In this case, the first electrode 253a and the second electrode 253b (that is, two points of the microphone board 250) are electrically and mechanically connected to the first connection hole 110a and the second connection hole 110b, respectively, of the main board 100 by soldering, welding, or with a conductive adhesive.

Case b): The first electrode 253a is provided on the first or second face of the first end portion 252a, the second electrode 253b is provided on the first or second face of the second end portion 252b, the first electrode 253a includes the first exposed portion 253a1 and the second exposed portion 253a2, and the second electrode 253b includes the first exposed portion 253b1 and the second exposed portion 253b2. In this case, the first exposed portion 253a1 of the first electrode 253a and the second exposed portion 253a2 of the first electrode 253a are electrically and mechanically connected to the first connection hole 110a of the main board 100 by soldering, welding, or with a conductive adhesive, and the first exposed portion 253b1 of the second electrode 253b and the second exposed portion 253b2 of the second electrode 253b are electrically and mechanically connected to the second connection hole 110b of the main board 100 by soldering, welding, or with a conductive adhesive. The microphone board 250 is thus mechanically connected to the main board 100 at four points in total, namely at the first exposed portion 253a1, the second exposed portion 253a2, the first exposed portion 253b1, and the second exposed portion 253b2.

Case c): A plurality of the first electrodes 253a is provided respectively on the first and second faces of the first end portion 252a, a plurality of the second electrodes 253b is provided respectively on the first and second faces of the second end portion 252b, the first electrodes 253a each include the first exposed portion 253a1 and a second exposed portion 253a2, and the second electrodes 253b each include the first exposed portion 253b1 and the second exposed portion 253b2. In this case, the first exposed portion 253a1 of the first electrode 253a on the first face of the first end portion 252a, the second exposed portion 253a2 of the first electrode 253a on the first face of the first end portion 252a, the first exposed portion 253a1 of the first electrode 253a on the second face of the first end portion 252a, and the second exposed portion 253a2 of the first electrode 253a on the second face of the first end portion 252a are electrically and mechanically connected to the first connection hole 110a of the main board 100 by soldering, welding, or with a conductive adhesive. Also, the first exposed portion 253b1 of the second electrode 253b on the first face of the second end portion 252b, the second exposed portion 253b2 of the second electrode 253b on the first face of the second end portion 252b, the first exposed portion 253b1 of the second electrode 253b on the second face of the second end portion 252b, and the second exposed portion 253b2 of the second electrode 253b on the second face of the second end portion 252b are electrically and mechanically connected to the second connection holes 110b of the main board 100 by soldering, welding, or with a conductive adhesive. The microphone board 250 is thus mechanically connected to the main board 100 at eight points in total, namely at two first exposed portions 253a1, two second exposed portions 253a2, two first exposed portions 253b1, and two second exposed portions 253b2.

Technical feature and effect (4): If the assembly A1 includes the holder 400, the microphone board 250 is held by the holding portion 420 of the holder 400, so that the microphone board 250 is stably connected to the main board 100 as at least partly oriented perpendicularly or obliquely to the first face 101 or the second face 102 of the main board 100. This is particularly true if the microphone board 250 is a rigid board because the opposite ends of the microphone board 250 can easily be inserted into the pair of slits 421 of the holding portion 420 from the main board 100 side and held by the slits 421.

Second Embodiment

Figure 4:
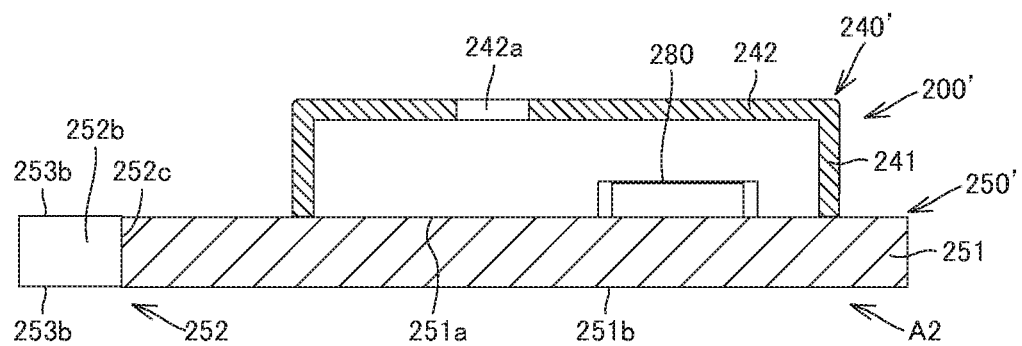
FIG. 4 is a sectional view, corresponding to FIG. 3D, of a microphone of a microphone assembly according to a second embodiment of the invention.

We now describe a microphone assembly A2 (hereinafter also referred to as an assembly A2) according to various embodiments including a second embodiment of the invention with reference to FIG. 4. FIG. 4 only shows the microphone 200' of the assembly A2 of the second embodiment. Other components of the are assembly A2 will be described referring to FIGS. 1A to 3E. The assembly A2 has the same configuration as the assembly A1, except that the assembly A2 includes a microphone 200' of a different configuration from that of the microphone 200 of the assembly A1. The assembly A2 will now be described focusing on the differences from the assembly A1 and omitting overlapping descriptions.

The microphone 200' is a MEMS microphone. The microphone 200' includes a MEMS chip 280 fabricated using microelectromechanical systems (MEMS) technology, a case 240', and a microphone board 250'. The microphone board 250' has the same configuration as that of the microphone board 250 of the assembly A1, except that the microphone board 250' is not provided with an insertion hole 251c. The connection conductor 251d is provided on the first face 251a of the fixing portion 251, and electrically connected to the tube 241 of the case 240'. The case 240' has the same configuration as that of the case 240 of the assembly A1, except that the case 240' does not include the leg 243. The MEMS chip 280 is mounted on the first face 251a of the fixing portion 251 of the microphone board 250', and electrically connected to the at least one first electrode 253a of the first end portion 252a and the at least one second electrode 253b of the second end portion 252b via the microphone board 250'. The MEMS chip 280 includes a capacitor (not shown) consisting of a diaphragm and a fixed electrode.

The microphone 200' may further include an electronic circuit (not shown). The electronic circuit may preferably be mounted on the first face 251a of the fixing portion 251 of the microphone board 250' and accommodated inside the case 240'. The electronic circuit may be mounted, not on the microphone board 250', but on the main board 100.

The assembly A2 provides similar technical features and effects to those of the assembly A1.

The microphone assembly is not limited to the above embodiments but may be modified in any manner within the scope of the claims. Specific modification examples will be described below.

The connecting portion of the microphone board of the microphone of the invention may be modified in any manner as long as it is a portion of the microphone board, the portion being located outside the case and electrically and mechanically connected to the main board. For example, the connecting portion of the microphone board may be electrically and mechanically connected to a conductive member on the main board by soldering, welding, or with a conductive adhesive. This modification is also adapted for changing the orientation of the microphone by changing the orientation of the conductive member on the main board. The main board 100 may be modified to be provided with the first connection hole 110a (corresponding to the connection hole in the claims) of any of the above aspects, but not provided with a second connection hole 110b. In this case, the connecting portion 252 may include the first end portion 252a (corresponding to the connecting portion in the claims) and the at least one first electrode 253a of any of the above aspects, or alternatively include the first end portion 252a (corresponding to the connecting portion in the claims), the at least one first electrode 253a, and the abutment 252c of any of the above aspects. In the former configuration, the second end portion 252b, the at least one second electrode 253b, and the abutment 252c are omitted. In the latter configuration, the second end portion 252b and the at least one second electrode 253b are omitted.

The accommodation space to accommodate the microphone of the holder of the invention may extend through the holder in the Z-Z' direction. In this case, the accommodation space may be fixed onto the first face of the main board such that the Z'-direction side of the accommodation space is closed with the main board, or fixed onto the second face of the main board such that the Z-direction side of the accommodation space is closed with the main board.

It should be appreciated that the microphone assembly of the above embodiments and variants thereof are described above by way of examples only. The materials, shapes, dimensions, numbers, arrangements, and other configurations of the constituents of the microphone assembly may be modified in any manner if they can perform similar functions. The configurations of the embodiments and the variants described above may be combined in any possible manner. The Z-Z' direction of the invention may be any direction corresponding to the thickness direction of the main board of the invention. The Y-Y' direction of the invention may be any direction intersecting the Z-Z' direction. The X-X' direction of the invention may be any direction intersecting the Z-Z' and Y-Y' directions and lying on a different plane from that formed by the Z-Z' and Y-Y' directions.

The present invention can include any combination of these various features or embodiments above and/or below as set-forth in sentences and/or paragraphs. Any combination of disclosed features herein is considered part of the present invention and no limitation is intended with respect to combinable features.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

REFERENCE SIGNS LIST

A1, A2: microphone assembly
100: main board
  101: first face
  102: second face
  110a: first connection hole
    111a: opening
    112a: opening
  110b: second connection hole
    111b: opening
    112b: opening 200, 200': microphone
　210: capacitor
　　211: diaphragm
　　212: fixed electrode
　220: ring
　230: spacer
　240, 240': case
　　241: tube
　　242: closing plate
　　　242a: sound hole
　　243: leg
　250, 250': microphone board
　　251: fixing portion
　　　251a: first face
　　　251b: second face
　　　251c: insertion hole
　　　251d: connection conductor
　　　251e: connection conductor
　　　251f: ground conductor
　　　251g: conductive adhesive
　　252: connecting portion
　　　252a: first end portion
　　　252b: second end portion
　　　252c: abutment
　　253a: first electrode
　　　253a1: first exposed portion
　　　253a2: second exposed portion
　　　253a3: intermediate portion
　　253b: second electrode
　　　253b1: first exposed portion
　　　253b2: second exposed portion
　　　253b3: intermediate portion
　261: gate ring (conductive member)
　262: acoustic resistance ring (conductive member)
　263: acoustic resistance plate (conductive member)
　270: insulator
　280: MEMS chip
　300: external connection
　400: holder
　　410: accommodation space
　　　411: front chamber
　　　412: rear chamber
　　　413: cloth
　　420: holding portion

What is claimed is:

1. A microphone assembly comprising:
a main board including a first face, a second face on an opposite side to the first face, and first and second connection holes in the first or second face; and
a microphone, the microphone including:
　a capacitor or a MEMS chip,
　a case accommodating the capacitor or the MEMS chip, and
　a microphone board electrically connected to the capacitor or the MEMS chip, wherein
the microphone board has a larger outer dimension than the case and includes a fixing portion and a connecting portion,
the case is fixed onto the fixing portion,
the connecting portion of the microphone board of the microphone is a portion of the microphone board, the connecting portion being located outside the case and including:
　a first end portion received in the first connection hole and electrically and mechanically connected to the main board,
　a second end portion received in the second connection hole and electrically and mechanically connected to the main board, and
　an abutment being provided between the first end portion and the second end portion and abutting the first or second face of the main board, and
the microphone board is disposed such as to at least partly extend perpendicularly or obliquely to the first or second face of the main board.

2. The microphone assembly according to claim 1, wherein
the connecting portion of the microphone board of the microphone further includes a first electrode and a second electrode,
the first end portion includes a first face and a second face on an opposite side to the first face of the first end portion,
the second end portion includes a first face and a second face on an opposite side to the first face of the second end portion,
the first electrode is provided on at least one of the first and second faces of the first end portion, and electrically and mechanically connected to the main board with the first end portion received in the first connection hole, and
the second electrode is provided on at least one of the first and second faces of the second end portion, and electrically and mechanically connected to the main board with the second end portion received in the second connection hole.

3. The microphone assembly according to claim 2, wherein
the first connection hole and the second connection hole pass through the main board from the first face to the second face of the main board, and each of the first connection hole and the second connection hole has a first opening and a second opening on an opposite side to the first opening,
the first end portion is received in, and passes through, the first connection hole,
the second end portion is received in, and passes through, the second connection hole, and
the first electrode includes:
　a first exposed portion exposed to an outside through the first opening of the first connection hole and electrically and mechanically connected to the main board;
　a second exposed portion exposed to the outside through the second opening of the first connection hole and electrically and mechanically connected to the main board; and
　an intermediate portion being located in the first connection hole and interconnecting the first exposed portion and the second exposed portion of the first electrode,
the second electrode includes:
　a first exposed portion exposed to the outside through the first opening of the second connection hole and electrically and mechanically connected to the main board;
　a second exposed portion exposed to the outside through the second opening of the second connection hole and electrically and mechanically connected to the main board; and an intermediate portion being located in the second connection hole and interconnecting the first exposed portion and the second exposed portion of the second electrode.

4. The microphone assembly according to claim 3, wherein
the first electrode comprises a plurality of first electrodes provided on the first and second faces of the first end portion, and
the second electrode comprises a plurality of second electrodes provided on the first and second faces of the second end portion.

5. The microphone assembly according to claim 4, wherein
the connecting portion of the microphone board of the microphone further includes an abutment between the first end portion and the second end portion, and
the abutment abuts the first or second face of the main board.

6. The microphone assembly according to claim 5, wherein
the abutment is a bottom of a recess between the first end portion and the second end portion of the microphone board.

7. The microphone assembly according to claim 1, wherein
the abutment is a bottom of a recess between the first end portion and the second end portion of the microphone board.

8. The microphone assembly according to claim 2, further comprising a holder on the first or second face of the main board, wherein
the holder includes an accommodation space to accommodate the microphone, and
the microphone board of the microphone partitions the accommodation space into a front chamber and a rear chamber.

9. The microphone assembly according to claim 8, wherein
the holder further includes a holding portion, and
the holding portion holds the microphone board, with the microphone board at least partly extending perpendicularly or obliquely to the first or second face of the main board.

10. The microphone assembly according to claim 3, wherein
the connecting portion of the microphone board of the microphone further includes an abutment between the first end portion and the second end portion, and
the abutment abuts the first or second face of the main board.

11. The microphone assembly according to claim 10, wherein
the abutment is a bottom of a recess between the first end portion and the second end portion of the microphone board.

12. The microphone assembly according to claim 4, further comprising a holder on the first or second face of the main board, wherein
the holder includes an accommodation space to accommodate the microphone, and
the microphone board of the microphone partitions the accommodation space into a front chamber and a rear chamber.

13. The microphone assembly according to claim 1, further comprising a holder on the first or second face of the main board, wherein the holder includes an accommodation space to accommodate the microphone, and
the microphone board of the microphone partitions the accommodation space into a front chamber and a rear chamber.

14. The microphone assembly according to claim 3, further comprising a holder on the first or second face of the main board, wherein
the holder includes an accommodation space to accommodate the microphone, and
the microphone board of the microphone partitions the accommodation space into a front chamber and a rear chamber.

15. The microphone assembly according to claim 1, wherein
the microphone board of the microphone further includes:
a ground conductor of loop shape provided on the microphone board such as to be located around, and in spaced relation to the case; and
a conductive adhesive portion of loop shape provided in a region on the microphone board between the case and the ground conductor.

16. The microphone assembly according to claim 1, wherein
the connecting portion of the microphone board of the microphone is U-shaped including legs and a recess between the legs,
the first and second end portions of the connecting portion are the legs of the connecting portion, and
the abutment is a bottom of the recess between the first end portion and the second end portion of the microphone board.

17. A microphone assembly comprising:
a main board including a first face, a second face on an opposite side to the first face, and a connection hole in the first or second face;
a microphone, the microphone including:
a capacitor or a MEMS chip,
a case accommodating the capacitor or the MEMS chip, and
a microphone board electrically connected to the capacitor or the MEMS chip, and
a holder on the first or second face of the main board, wherein
the holder includes an accommodation space to accommodate the microphone,
the microphone board has a larger outer dimension than the case and includes a fixing portion and a connecting portion,
the case is fixed onto the fixing portion,
the connecting portion of the microphone board is a portion of the microphone board, located outside the case, received in the connection hole of the main board, and electrically and mechanically connected to the main board, and
the microphone board of the microphone is disposed such as to at least partly extend perpendicularly or obliquely to the first or second face of the main board and partitions the accommodation space into a front chamber and a rear chamber.

18. The microphone assembly according to claim 17, wherein
the holder further includes a holding portion, and
the holding portion holds the microphone board, with the microphone board at least partly extending perpendicularly or obliquely to the first or second face of the main board.

19. A microphone assembly comprising:
a main board; and
a microphone, the microphone including:
- a capacitor or a MEMS chip,
- a case accommodating the capacitor or the MEMS chip, and
- a microphone board electrically connected to the capacitor or the MEMS chip, wherein the microphone board has a larger outer dimension than the case and includes a fixing portion and a connecting portion, the case is fixed onto the fixing portion, the connecting portion is a portion of the microphone board, the portion being located outside the case and electrically and mechanically connected to the main board, the fixing portion of the microphone board includes a first face, a second face on an opposite side to the first face of the fixing portion, and a nonconductive insertion hole, the insertion hole extends through the fixing portion from the first face of the fixing portion to the second face of the fixing portion, the case of the microphone includes a leg, and the leg passes through the insertion hole from the first face side of the fixing portion and is fixed to the second face of the fixing portion by soldering.

\* \* \* \* \*